(12) United States Patent
Huang et al.

(10) Patent No.: US 11,574,997 B1
(45) Date of Patent: Feb. 7, 2023

(54) SEMICONDUCTOR STRUCTURE AND OPERATION CIRCUIT

(71) Applicant: Vanguard International Semiconductor Corporation, Hsinchu (TW)

(72) Inventors: Shao-Chang Huang, Hsinchu (TW); Li-Fan Chen, Hsinchu (TW); Ching-Ho Li, Hsinchu (TW); Gong-Kai Lin, Luodong Township (TW); Chieh-Yao Chuang, Kaohsiung (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/391,693

(22) Filed: Aug. 2, 2021

(51) Int. Cl.
| | |
|---|---|
| H01L 29/06 | (2006.01) |
| H01L 29/15 | (2006.01) |
| H01L 29/66 | (2006.01) |
| H01L 29/778 | (2006.01) |
| H03K 17/687 | (2006.01) |
| H01L 29/78 | (2006.01) |
| H01L 29/40 | (2006.01) |

(52) U.S. Cl.
CPC ........ *H01L 29/0611* (2013.01); *H01L 29/402* (2013.01); *H01L 29/7816* (2013.01); *H03K 17/687* (2013.01)

(58) Field of Classification Search
None
See application file for complete search history.

(56) References Cited

U.S. PATENT DOCUMENTS

| | | | | |
|---|---|---|---|---|
| 7,800,176 B2 * | 9/2010 | Werner | ................... | H01L 24/06 |
| | | | | 257/329 |
| 8,253,197 B2 | 8/2012 | Lotfi et al. | | |
| 8,653,558 B2 * | 2/2014 | Green | ................. | H01L 29/7787 |
| | | | | 257/E21.403 |

(Continued)

FOREIGN PATENT DOCUMENTS

| | | |
|---|---|---|
| TW | I600160 B | 9/2017 |
| TW | I693717 B | 5/2020 |

OTHER PUBLICATIONS

Taiwanese Office Action and Search Report for Taiwanese Application No. 110110749, dated Mar. 9, 2022.

*Primary Examiner* — Kenneth B Wells
(74) *Attorney, Agent, or Firm* — Birch, Stewart, Kolasch & Birch, LLP

(57) ABSTRACT

A semiconductor structure including a substrate, a first well, a second well, a first doped region, a second doped region, a gate electrode, an insulating layer, a field plate, and a tunable circuit is provided. The first and second wells are formed on the substrate. The first doped region is formed in the first well. The second doped region is formed in the second well. The gate electrode is disposed over the substrate. The gate electrode, the first doped region, and the second doped region constitute a transistor. The insulating layer is disposed on the substrate and overlaps the gate electrode. The field plate overlaps the insulating layer and the gate electrode. The tunable circuit provides either a first short-circuit path between the field plate and the gate electrode, or a second short-circuit path between the field plate and the first doped region.

20 Claims, 4 Drawing Sheets

(56) References Cited

U.S. PATENT DOCUMENTS

| | | | |
|---|---|---|---|
| 8,847,310 B1 | 9/2014 | Korec | |
| 2007/0235775 A1* | 10/2007 | Wu | H01L 29/7787 |
| | | | 257/E29.127 |
| 2008/0272397 A1* | 11/2008 | Koudymov | H01L 29/1606 |
| | | | 257/192 |
| 2014/0361341 A1* | 12/2014 | Sriram | H01L 29/42316 |
| | | | 257/194 |
| 2019/0334032 A1* | 10/2019 | Ho | H01L 29/66689 |
| 2020/0052103 A1* | 2/2020 | Tao | H01L 29/7787 |

\* cited by examiner

SEMICONDUCTOR STRUCTURE AND OPERATION CIRCUIT

BACKGROUND OF THE INVENTION

Field of the Invention

The disclosure relates to the field of semiconductor structures, and more particularly to high-voltage semiconductor structures.

Description of the Related Art

High-voltage semiconductor devices use gate voltages to generate channels and control the current flowing between the source and drain. In a conventional high-voltage semiconductor structure, the length of the channel is increased to avoid a punch-through effect between the source and the drain. However, the size of the device is increased, meaning that the chip area is also increased, causing the turn-on resistance of the transistor to be higher.

BRIEF SUMMARY OF THE INVENTION

In accordance with an embodiment of the disclosure, a semiconductor structure comprises a substrate, a first well, a second well, a first doped region, a second doped region, a gate electrode, an insulating layer, a field plate, and a tunable circuit. The substrate has a first conductivity type. The first well is formed on the substrate and has the first conductivity type. The second well is formed on the substrate and has a second conductivity type. The first doped region is formed in the first well and has the second conductivity type. The second doped region is formed in the second well and has the second conductivity type. The gate electrode is disposed over the substrate. The gate electrode, the first doped region, and the second doped region constitute a first transistor. The insulating layer is disposed on the substrate and overlaps a portion of the gate electrode. The field plate overlaps the insulating layer and the gate electrode. The tunable circuit is coupled to the field plate, the tunable circuit, and the first doped region. The tunable circuit provides a first short-circuit path between the field plate and the gate electrode, or it provides a second short-circuit path between the field plate and the first doped region.

In accordance with another embodiment of the disclosure, an operation circuit comprises a first transistor, a first tunable circuit, a second transistor, and a second tunable circuit. The first transistor is formed in a first region of a substrate and comprises a field plate contact, a first gate contact, and a first source contact. The first tunable circuit forms a first short-circuit path between the first field plate contact and the first gate contact or forms a second short-circuit path between the first field plate contact and the first source contact. The second transistor is formed in a second region of the substrate and comprises a second field plate contact, a second gate contact, and a second source contact. The second tunable circuit forms a third short-circuit path between the second field plate contact and the second gate contact, or forms a fourth short-circuit path between the second field plate contact and the second source contact.

BRIEF DESCRIPTION OF THE DRAWINGS

The disclosure can be more fully understood by referring to the following detailed description and examples with references made to the accompanying drawings, wherein.

DETAILED DESCRIPTION OF THE INVENTION

Figure 1:
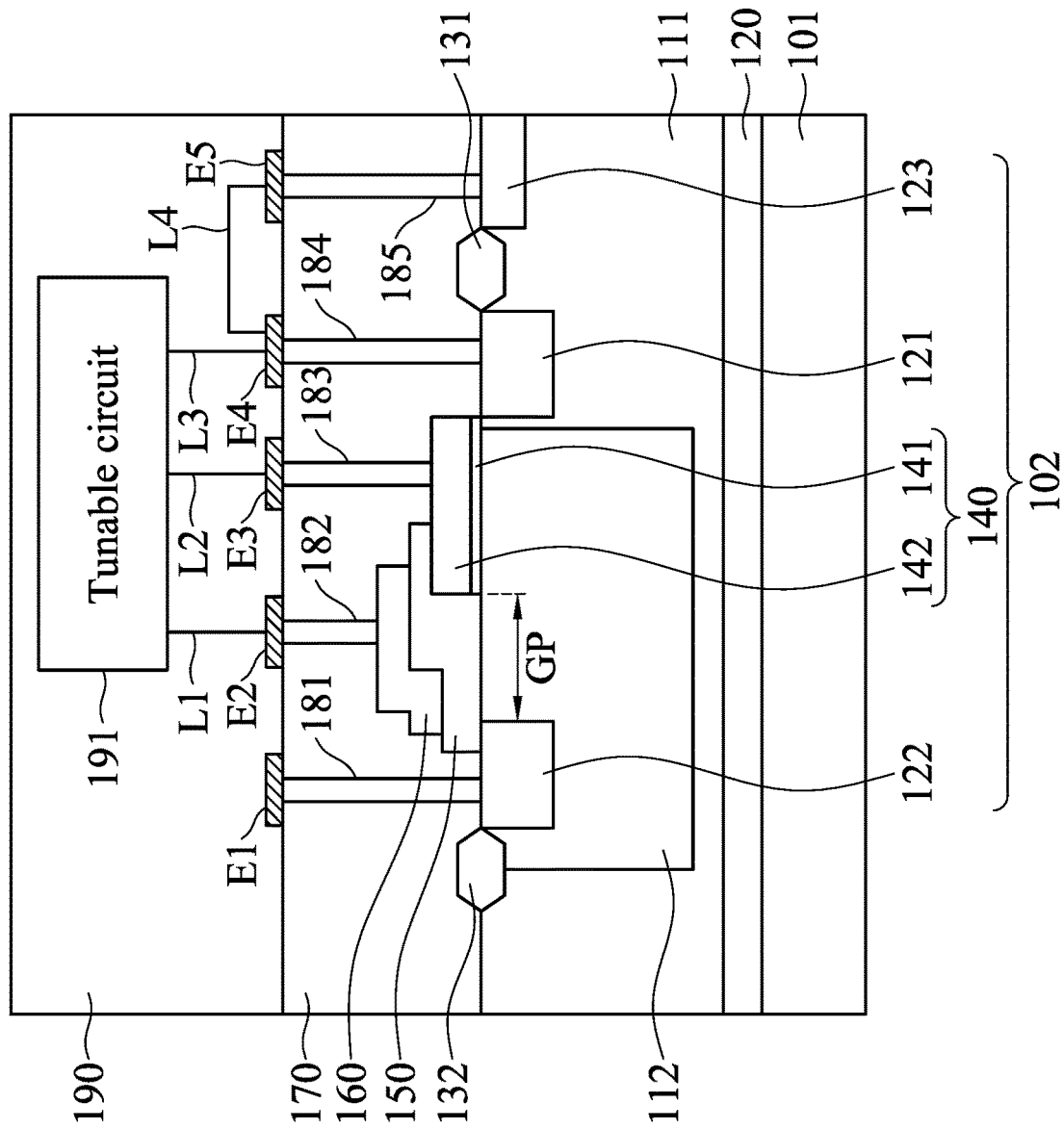
FIG. 1 is a schematic diagram of an exemplary embodiment of a semiconductor structure according to various aspects of the present disclosure.

In order to achieve the above-mentioned purposes and effects, the technical means and structure adopted by the present invention are illustrated in a schematic manner and in conjunction with the preferred embodiments of the present invention, and its features and functions are described in detail as follows, for the benefit of a complete understanding.

In the present disclosure, the formation of a first feature over or on a second feature in the description may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Furthermore, spatially relative terms, such as "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, preferably within 10%, and more preferably within 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

FIG. 1 is a schematic diagram of an exemplary embodiment of a semiconductor structure according to various aspects of the present disclosure. As shown in FIG. 1, the semiconductor structure 100 comprises a substrate 101, wells 111 and 112, doped regions 121 and 122, a gate structure 140, an insulating layer 150 and a field plate 160. In this embodiment, the semiconductor structure 100 is a high-voltage semiconductor structure. For example, the semiconductor structure 100 can receive a voltage above 18 volts.

The substrate 101 may be a semiconductor substrate, such as a silicon substrate, an epitaxial III-V compound substrate, a silicon/germanium substrate, a silicon carbide substrate or a silicon-on-insulator (SOI) substrate. Additionally, the substrate 101 may comprise semiconductor material, such as silicon, SiGe, or III-V compound. In this embodiment, the substrate 101 has a first conductivity type. In other embodiments, a buried layer (BL) 120, the wells 111 and 112 are disposed in the substrate 101.

The wells 111 and 112 are formed in the substrate 101. The well 111 has the first conductivity type (for example, P-type). The well 112 is formed in the well 111. The well 112 has a second conductivity type (for example, N-type). The first conductivity type is opposite to the second conductivity type. In one embodiment, the buried layer 120 may have the second conductivity type (for example, N-type). The buried layer 120 is disposed between the well 111 and the substrate 101. The doped concentration of the buried layer 120 may be higher than the doped concentration of the well 112. In one embodiment, the well 112 is surrounded by the well 111. A person skilled in the art may adjust the doped types thereof as needed, and the present disclosure is not limited herein.

The doped region 121 is formed in the well 111 and has the second conductivity type. In one embodiment, the doped concentration of the doped region 121 is higher than the doped concentration of the well 112. In some embodiments, the semiconductor structure 100 further comprises a doped region 123. The doped region 123 is formed in the well 111 and has the first conductivity type. The doped concentration of the doped region 123 is higher than the doped concentration of the well 111. In other embodiments, a shallow trench isolation (STI) manufacturing procedure is utilized to form a trench isolation 131 in the well 111 to isolate the doped regions 121 and 123. However, any other suitable method can also be used to separate the doped regions 121 and 123. For example, the conventional local oxidation of silicon (LOCOS) method is used to form a field oxide to separate the doped regions 121 and 123 in the well 111.

The doped region 122 is formed in the well 112 and has the second conductivity type. In this embodiment, the doped concentration of the doped region 122 is higher than the doped concentration of the well 112. In some embodiments, the STI manufacturing procedure is utilized to form a trench isolation 132 in the wells 112 and 111 to isolate the well 111 and the doped region 122. In other embodiments, the LOCOS method is used to form a field oxide between the well 111 and the doped region 123.

The gate structure 140 is disposed over the substrate 101 and overlaps a portion of the well 111 and a portion of the well 112. The gate structure 140 comprises a gate dielectric layer 141 and a gate electrode 142. In this embodiment, the gate dielectric layer 141 may be formed over a partial surface of the wells 111 and 112. The gate dielectric layer 141 may comprise oxide, nitride, oxynitride, oxycarbide, or combinations thereof. Alternatively, the gate dielectric layer 141 may comprise a high-k (>8) dielectric material. Then, the gate electrode 142 is formed on the gate dielectric layer. In some embodiments, the gate electrode 142 may comprise silicon or polysilicon. The gate electrode 142 is preferably a doped material for reducing sheet resistance. In other embodiments, the gate electrode 142 comprises amorphous silicon. Furthermore, a metal nitride and a metal silicide may be selectively formed on the surface of the gate electrode 142. In some embodiments, a gap GP is between the gate structure 140 and the doped region 122. In other words, the gate structure 140 does not contact the doped region 122.

In this embodiment, the gate electrode 142, the doped regions 121 and 122 constitute a transistor 102. The type of the transistor 102 is not limited in the present disclosure. In one embodiment, the transistor 102 is a lateral diffused metal oxide semiconductor (LD MOS) transistor. In this case, the gate electrode 142 serves as the gate of the transistor 102. The doped region 121 serves as the source region of the transistor 102. The doped region 122 serves as the drain region of the transistor 102. In other embodiments, the transistor 102 further comprises a doped region 123. In this case, the doped region 123 serves as the bulk of the transistor 102.

The insulating layer 150 is disposed on the substrate 101 and overlaps a portion of the gate structure 140. In this embodiment, the insulating layer 150 overlaps and directly contacts a portion of the doped region 122, a portion of the well 112, and a portion of the gate electrode 142. The material of the insulating layer 150 comprises oxide, nitride, oxynitride, or combinations thereof. Alternatively, the insulating layer 150 may comprise a low-k dielectric material, any other suitable dielectric material, or a combination thereof. The insulating layer 150 may be formed by a chemical vapour deposition (CVD) method. In some embodiments, the insulating layer 150 and the gate dielectric layer 141 are formed in different steps, but the disclosure is not limited thereto. In other embodiments, the insulating layer 150 and the gate dielectric layer 141 are formed in the same step, such as a chemical vapour deposition step. In this embodiment, the thickness of the insulating layer 150 is larger than the thickness of the gate dielectric layer 141.

The field plate 160 is disposed on the insulating layer 150 and overlaps a portion of the doped region 122 and the gate dielectric layer 141. In this embodiment, the field plate 160 directly contacts the insulating layer 150 and overlaps a portion of the insulating layer 150. The field plate 160 is used to homogenize the electric field distribution. In one embodiment, the field plate 160 is a conductor. The material of the conductor comprises metal or silicon.

In some embodiments, the semiconductor structure 100 further comprises an insulating layer 170. The insulating layer 170 overlaps the wells 111 and 112, the doped regions 121~123, the trench isolations 131 and 132, the gate structure 140, the insulating layer 150, and the field plate 160. Therefore, the field plate 160 and the gate dielectric layer 141 are located at the same insulating layer. In some embodiments, the insulating layers 150 and 170 are formed in different steps. For example, after forming the insulating layer 150, the field plate 160 is formed on the insulating layer 150. Then, the insulating layer 170 is formed.

In some embodiments, the semiconductor structure 100 further comprises a circuit layer 190. The circuit layer 190 comprises a tunable circuit 191, interconnect lines L1~L3, and electrodes E1~E5. The electrode E1 is electrically connected to the doped region 122 via the through hole 181. In one embodiment, the electrode E1 serves as the drain contact of the transistor 102. The electrode E2 is electrically connected to field plate 160 via the through hole 182. In one embodiment, the electrode E2 serves as the field plate contact of the transistor 102. The electrode E3 is electrically connected to the gate electrode 142 via the through hole 183. In one embodiment, the electrode E3 serves as the gate contact of the transistor 102. The electrode E4 is electrically connected to the doped region 121 via the through hole 184. In one embodiment, the electrode E4 serves as the source contact of the transistor 102. The electrode E5 is electrically connected to the doped region 123 via the through hole 185. In one embodiment, the electrode E5 serves as the bulk contact of the transistor 102.

In this embodiment, the tunable circuit 191 is electrically connected to the electrodes E2~E4 via the interconnect lines L1~L3. In this case, the tunable circuit 191 provides a first short-circuit path between the field plate 160 and the gate electrode 142 or provides a second short-circuit path between the field plate 160 and the doped region 121. When the first short-circuit path occurs between the field plate 160 and the gate electrode 142, the voltage level of the field plate 160 is the same as the voltage level of the gate electrode 142. At this time, the transistor 102 has a first turn-on resistance (Ron) and a first gate charge (Qg) value. When the second short-circuit path occurs between the field plate 160 and the doped region 121, the voltage level of the field plate 160 is the same as the voltage level of the doped region 121. At this time, the transistor 102 has a second turn-on resistance and a second gate charge value. In such case, the first turn-on resistance is less than the second turn-on resistance. The second gate charge value is less than the first gate charge value.

The structure of the tunable circuit 191 is not limited in the present disclosure. In one embodiment, the tunable circuit 191 turns on the first short-circuit path between the electrodes E2 and E3, or it turns on the second short-circuit path between the electrodes E2 and E4, according to a control signal (not shown). When the tunable circuit 191 turns on the first short-circuit path between the electrodes E2 and E3, the voltage level of the field plate 160 is equal to the voltage level of the gate electrode 142. When the tunable circuit 191 turns on the second short-circuit path between the electrodes E2 and E4, the voltage level of the field plate 160 is equal to the voltage level of the doped region 121.

In other embodiments, the circuit layer 190 further comprises an interconnect line L4. The interconnect line L4 is electrically connected to the electrodes E4 and E5. In some embodiments, the materials of the interconnect lines L1~L4 may comprise Cu, Al, W, doped poly-Si, any other suitable conductive materials, or a combination thereof.

Figure 2:
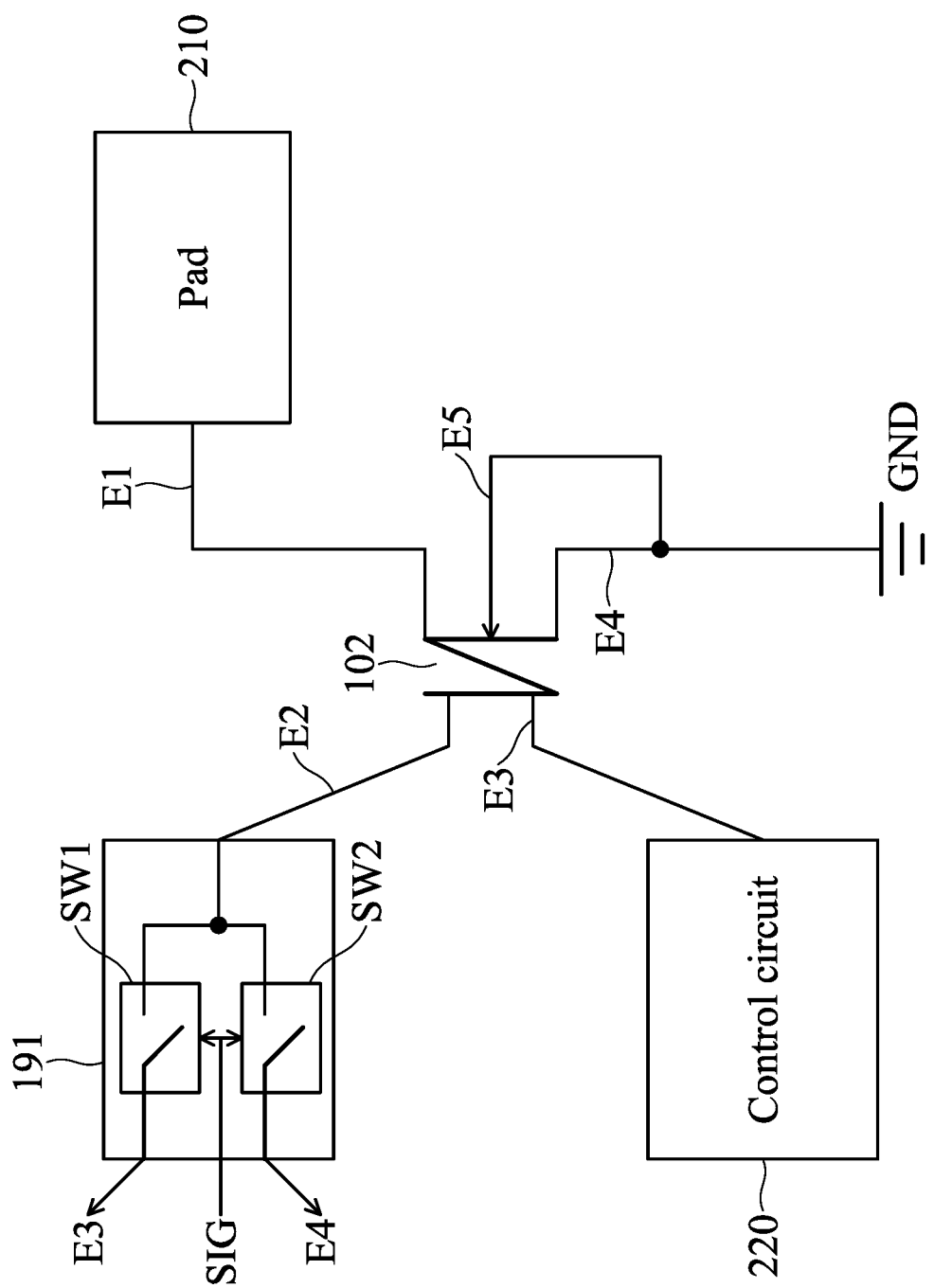
FIG. 2 is an equivalent circuit of the semiconductor structure according to various aspects of the present disclosure.

FIG. 2 is an equivalent circuit of the semiconductor structure 100 according to various aspects of the present disclosure. The semiconductor structure 100 comprises a transistor 102 and a tunable circuit 191. The doped region 122 of the transistor 102 is electrically connected to the electrode E1 referred to as a drain contact. In this embodiment, the electrode E1 is coupled to a pad 210. The pad 210 is configured to receive a control voltage. In one embodiment, the control voltage is above 40V.

The field plate 160 of the transistor 102 is electrically connected to the electrode E2 referred to as a field plate contact. The electrode E2 is coupled to the tunable circuit 191. The gate electrode 142 of the transistor 102 is electrically connected to the electrode E3 referred to as a gate contact. The electrode E3 is coupled to a control circuit 220. The control circuit 220 is configured to provide a gate voltage to the electrode E3. The voltage levels of the electrodes E1, E3, and E4 are controlled to turn on or off the transistor 102. The doped region 121 of the transistor 102 is electrically connected to the electrode E4 referred to as a source contact. The electrode E4 receives a ground voltage GND. The doped region 123 of the transistor 102 is electrically connected to the electrode E5 referred to as a bulk contact. The electrode E5 is coupled to the electrode E4.

In this embodiment, the tunable circuit 191 turns on a first short-circuit path between the electrodes E2 and E3, or it turns on a second short-circuit path between the electrodes E2 and E4, according to a control signal SIG. The source region providing the control signal SIG is not limited in the present disclosure. In one embodiment, the control signal SIG is provided by a one-time programmable (OTP) circuit or a multiple-time programmable (MTP) circuit.

Additionally, the structure of the tunable circuit 191 is not limited in the present disclosure. Any circuit can serve as the tunable circuit 191, as long as the circuit is capable of turning on one of two different short-circuit paths according to a control signal. In one embodiment, the tunable circuit 191 comprises switch circuits SW1 and SW2. The switch circuit SW1 is coupled between the electrodes E2 and E3 to provide a first short-circuit path between the electrodes E2 and E3. The switch circuit SW2 is coupled between the electrodes E2 and E4 to provide a second short-circuit path between the electrodes E2 and E4. In some embodiments, the tunable circuit 191 does not turn on both of the first and second short-circuit paths simultaneously.

For example, when the control signal SIG is at a first level (e.g., a high level), the switch circuit SW1 is turned on and the switch circuit SW2 is turned off. In such case, since the switch circuit SW1 is turned on, a first short-circuit path is formed between the electrodes E2 and E3. Therefore, the voltage level of the electrode E2 is the same as the voltage level of the electrode E3. At this time, the transistor 102 has a first turn-on resistance and a first gate charge value. In this case, since the switch circuit SW2 is turned off, the second short-circuit path is not formed between the electrodes E2 and E4.

When the control signal SIG is at a second level (e.g., a low level), the switch circuit SW1 is turned off and the switch circuit SW2 is turned on. In such case, since the switch circuit SW2 is turned on, a second short-circuit path is formed between the electrodes E2 and E4. Therefore, the voltage level of the electrode E2 is the same as the voltage level of the electrode E4, and the transistor 102 has a second turn-on resistance and a second gate charge value. In one embodiment, the first turn-on resistance is less than the second turn-on resistance, and the second gate charge value is less than the first gate charge value. When the second short-circuit path is formed between the electrodes E2 and E4, the switch circuit SW1 is turned off. Therefore, the switch circuit SW1 does not form the first short-circuit path between the electrodes E2 and E3.

In this embodiment, the switch circuits SW1 and SW2 receive the same control signal, but the disclosure is not limited thereto. In other embodiments, the switch circuits SW1 and SW2 receive different control signals. In such case, when the switch circuit SW1 provides the first short-circuit path between the electrodes E2 and E3, the switch circuit SW2 does not provide the second short-circuit path between the electrodes E2 and E4. When the switch circuit SW2 provides the second short-circuit path between the electrodes E2 and E4, the switch circuit SW1 does not provide the first short-circuit path between the electrodes E2 and E3.

Figure 3:
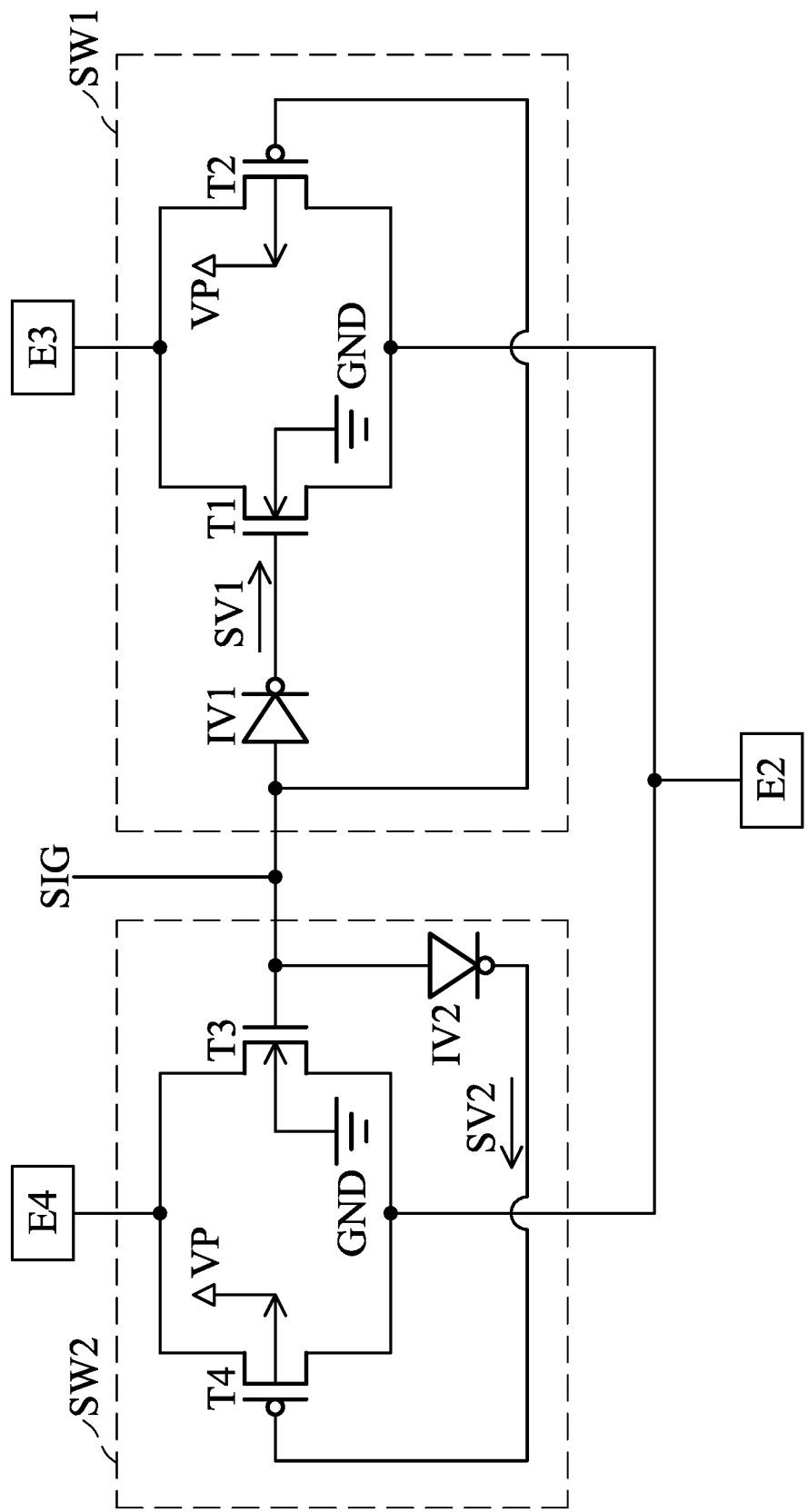
FIG. 3 is a schematic diagram of an exemplary embodiment of a tunable circuit according to various aspects of the present disclosure.

FIG. 3 is a schematic diagram of an exemplary embodiment of a tunable circuit according to various aspects of the present disclosure. In this embodiment, the switch circuit SW1 comprises an inverter IV1, switches T1 and T2. The inverter IV1 inverts the control signal SIG to generate an inverted signal SV1. The switch T1 is coupled between the electrodes E2 and E3 and receives the inverted signal SV1. The switch T2 is coupled between the electrodes E2 and E3 and receives the control signal SIG. The kinds of switches T1 and T2 are not limited in the present disclosure. In one embodiment, the switch T1 is an N-type transistor, and the switch T2 is a P-type transistor. In such case, the bulk of the switch T1 receives a ground voltage GND, and the bulk of the switch T2 receives a high operation voltage VP. When the control signal SIG is at a first level (e.g., a high level), the switches T1 and T2 are turned off. When the control signal SIG is at a second level (e.g., a low level), the switches T1 and T2 are turned on. Therefore, the voltage level of the electrode E2 is equal to the voltage level of the electrode E3.

The switch circuit SW2 comprises an inverter IV2, and switches T3 and T4. The inverter IV2 inverts the control signal SIG to generate an inverted signal SV2. The switch T3 is coupled between the electrodes E2 and E4 and receives the control signal SIG. The switch T4 is coupled between the electrodes E2 and E4 and receives the inverted signal SV2. The types of switches T3 and T4 are not limited in the present disclosure. In one embodiment, the switch T3 is an N-type transistor, and the switch T4 is a P-type transistor. In such case, the bulk of the switch T3 receives the ground voltage GND, and the bulk of the switch T4 receives the high operation voltage VP. When the control signal SIG is at a first level (e.g., a high level), the switches T3 and T4 are turned on. Therefore, the voltage level of the electrode E2 is equal to the voltage level of the electrode E4. When the control signal SIG is at a second level (e.g., a low level), the switches T3 and T4 are turned off.

Figure 4:
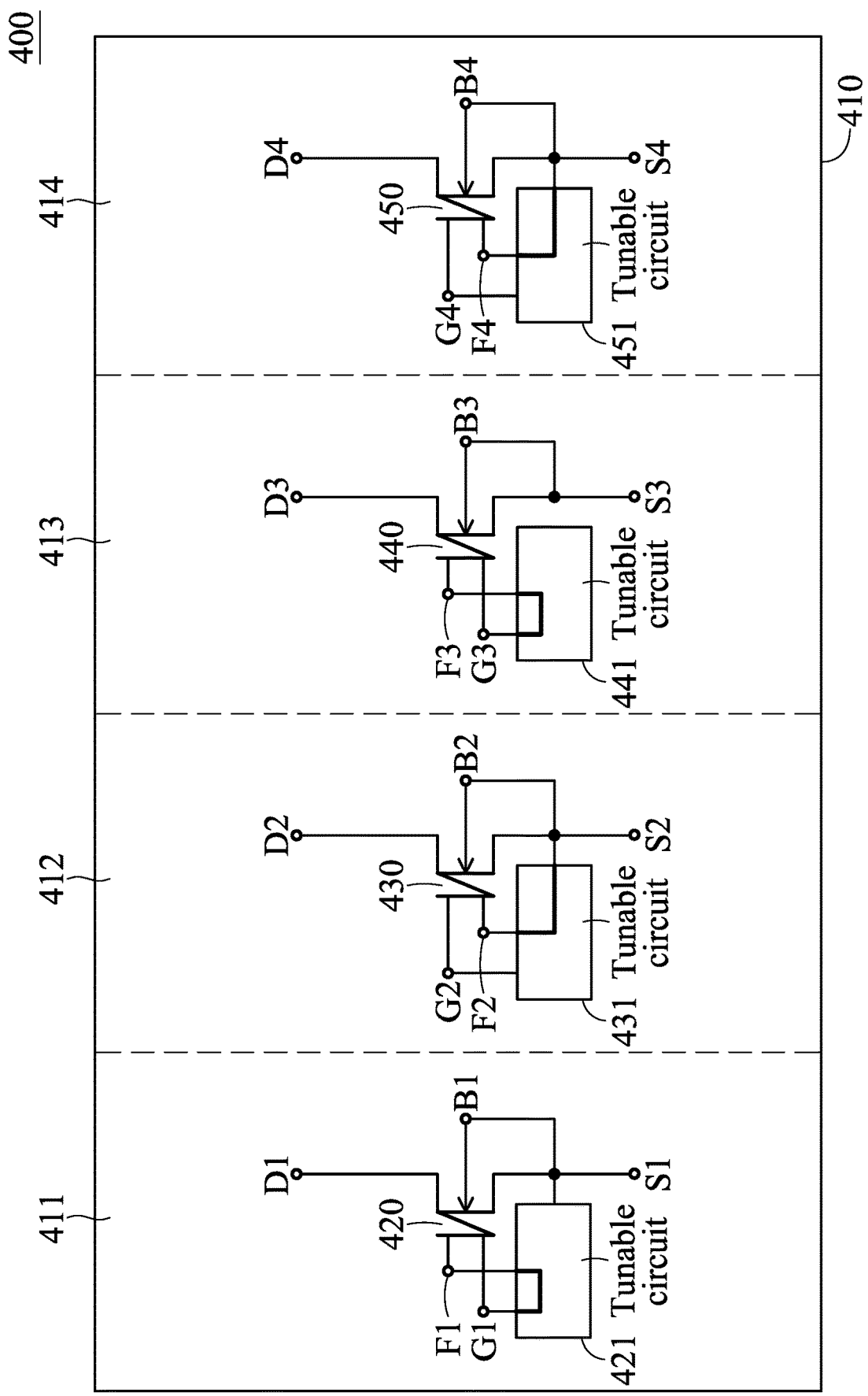
FIG. 4 is a schematic diagram of another exemplary embodiment of the semiconductor structure according to various aspects of the present disclosure.

FIG. 4 is a schematic diagram of another exemplary embodiment of the semiconductor structure according to various aspects of the present disclosure. The semiconductor structure 400 comprises a substrate 410. The substrate 410 comprises regions 411~414. The number of regions is not limited in the present disclosure. In other embodiments, the substrate 410 is divided into more or fewer regions. In this embodiment, the structure of each region is the same as the semiconductor structure 100.

Each of the regions 411~414 comprises a plurality of transistors. For brevity, FIG. 4 only shows four transistors 420, 430, 440, and 450. The transistors 420, 430, 440, and 450 are disposed in the regions 411~414, respectively. In one embodiment, each of the transistors 420, 430, 440, and 450 is a silicon MOS, such as an LD MOS transistor or a high electron mobility transistor (HEMT), such as, a gallium nitride (GaN) HEMT. In this embodiment, since the structure of each of the transistors 420, 430, 440, and 450 is similar to the structure of the transistor 102 of FIG. 1, the descriptions of structures of the transistors 420, 430, 440, and 450 are omitted.

The transistor 420 is located in region 411 and comprises a gate contact G1, a drain contact D1, a source contact S1, a bulk contact B1, and a field plate contact F1. The transistor 420 operates according to the voltage levels of the gate contact G1, the drain contact D1, and the source contact S1. In some embodiments, the bulk contact B1 may electrically connect to the source contact S1. In such case, a first tunable circuit (not shown) provides a short-circuit path between the field plate contact F1 and the gate contact G1. Therefore, the field plate contact F1 is electrically connected to the gate contact G1, but the disclosure is not limited thereto. In other embodiments, the first tunable circuit may provide a short-circuit path between the field plate contact F1 and source contact S1. In some embodiments, the first tunable circuit may be located in region 411.

The transistor 430 is located in region 412 and comprises a gate contact G2, a drain contact D2, a source contact S2, a bulk contact B2, and a field plate contact F2. The transistor 430 operates according to the voltage level of the gate contact G2, the drain contact D2, and the source contact S2. In some embodiments, the bulk contact B2 may electrically connect to the source contact S2. In such case, a second tunable circuit (not shown) provides a short-circuit path between the field plate contact F2 and the source contact S2. Therefore, the field plate contact F2 is electrically connected to the source contact S2. In this case, the transistor 430 has a gate charge value which is sufficient to turn on the transistor 430 and is less than the gate charge value of the transistor 420. Therefore, the transistor 430 has a faster switching speed. In other embodiments, the second tunable circuit may provide a short-circuit path between the field plate contact F2 and the gate contact G2. In some embodiments, the tunable circuit may be disposed in the region 412.

The transistor 440 is disposed in the region 413 and comprises a gate contact G3, a drain contact D3, a source contact S3, a bulk contact B3, and a field plate contact F3. The transistor 440 operates according to the voltage levels of the gate contact G3, the drain contact D3, and the source contact S3. In some embodiments, the bulk contact B3 is electrically connected to the source contact S3. In this embodiment, a third tunable circuit (not shown) provides a short-circuit path between the field plate contact F3 and the gate contact G3. Therefore, the field plate contact F3 is electrically connected to the gate contact G3. In this case, the turn-on resistance and the gate charge value of the transistor 440 are similar to the turn-on resistance and the gate charge value of the transistor 420. In one embodiment, the turn-on resistance of the transistor 440 is less than the turn-on resistance of the transistor 430. Therefore, the power consumption of the transistor 440 is less than the power consumption of the transistor 430. In other embodiments, the third tunable circuit may provide a short-circuit path between the field plate contact F3 and the source contact S3. In some embodiments, the third tunable circuit may be disposed in the region 413.

The transistor 450 is located at the region 414 and comprises a gate contact G4, a drain contact D4, a source contact S4, a bulk contact B4, and a field plate contact F4. The transistor 450 operates according to the voltage levels of the gate contact G4, the drain contact D4, and the source contact S4. In some embodiments, the bulk contact B4 is electrically connected to the source contact S4. In this embodiment, a fourth tunable circuit (not shown) provides a short-circuit path between the field plate contact F4 and the source contact S4. Therefore, the voltage level of the field plate contact F4 is electrically connected to the source contact S4. In this case, the turn-on resistance and the gate charge value of the transistor 450 are similar to the turn-on resistance and the gate charge value of the transistor 430. Additionally, the gate charge value of the transistor 450 is less than the gate charge value of each of the transistors 420 and 440. In other embodiments, the fourth tunable circuit may provide a short-circuit path between the field plate contact F4 and the gate contact G4. The fourth tunable circuit may be disposed in the region 414.

In FIG. 4, since the substrate 410 is divided into the regions 411~414 and the field plate contacts in the regions 411 and 413 are electrically connected to the gate contacts, the structures of fifty percent of the transistors in the substrate 410 are metal-to-gate (MTG) structures. Additionally, since the field plate contacts in regions 412 and 414 are electrically connected to the source contacts, the structures of fifty percent of the transistors in the substrate 410 are metal-to-source (MTS) structures.

Since the turn-on resistance of the transistor which is classified as an MTG structure is low resistance, the power consumption of the transistor classified as an MTG structure is low. The transistor classified as an MTS structure has a low gate charge value, and the switching speed of the transistor is fast. Since the figure of merit (FOM) is proportional to the product of the turn-on resistance and the gate charge value, the substrate 410 has the better FOM.

In other embodiments, it is possible that the field plate contacts are electrically connected to the gate contacts of the transistors in a single region of the substrate 410. In this case, the number of transistors having an MTG structure is about twenty-five percent of total number of transistors. In another embodiment, if there are three regions and each region has many transistors which comprise field plate contacts electrically connected to gate contacts, the number of transistors having an MTG structure is about seventy-five percent of total number of transistors. If the field plate contacts are electrically connected to the gate contacts of the transistors in all regions (411~414), the number of transistors having an MTG structure is about one hundred percent of total number of transistors. However, if the field plate contacts are not electrically connected to the gate contacts of the transistors in all regions (411~414), the number of transistors having an MTG structure is about zero percent of total number of transistors. The user can adjust the number of transistors having an MTG structure and number of transistors having an MTS structure according to the actual application to optimize the FOM so that the components have higher efficiency.

The locations of the transistors having an MTG structure are not limited in the present disclosure. If the number of transistors having an MTG structure is limited to fifty percent of total number of transistors, the control signal SIG is adjusted so that the structures of the transistors in two of regions 411~414 are MTG structures. In this embodiment, since the tunable circuits (not shown) in the regions 411 and 413 turn on the short-circuit paths between the field plate contact F1 and the gate contact G1 and the field plate contact F3 and the gate contact G3 according to the control signal SIG, the structures of the transistors in regions 411 and 413 are MTG structures. In other embodiments, if the tunable circuits (not shown) in regions 411 and 412 turn on the short-circuit paths between the field plate contact F1 and the gate contact G1 and the field plate contact F2 and the gate contact G3 according to the control signal SIG, the structures of the transistors in regions 411 and 412 are MTG structures. Similarly, if the tunable circuits (not shown) in regions 411 and 414 turn on the short-circuit paths between the field plate contact F1 and the gate contact G1 and the field plate contact F4 and the gate contact G4 according to the control signal SIG, the structures of the transistors in the regions 411 and 414 are MTG structures. In other words, the tunable circuit in each region of the substrate can form an MTG structure or an MTS structure, according to different control signals.

In some embodiments, the short-circuit paths in each region are not fixed. For example, when the number of transistors having an MTG structure is limited to fifty percent of the total number of transistors, the tunable circuits (not shown) in the regions 411 and 413 turn on the short-circuit paths between the field plate contact F1 and the gate contact G1 and the short-circuit paths between the field plate contact F3 and the gate contact G3 according to the control signal SIG. However, when the number of transistors having an MTG structure is limited to twenty-five percent of the total number of transistors, the tunable circuit (not shown) in one of the regions 411 and 413 turns on the short-circuit path between the corresponding field plate contact and the corresponding gate contact according to the control signal SIG. In such case, the tunable circuit in the other of the regions 411 and 413 may turn on the short-circuit path between the corresponding field plate contact and the corresponding source contact according to the control signal SIG. In some embodiments, the tunable circuit in the other of the regions 411 and 413 may turn off the short-circuit path between the corresponding field plate contact and the corresponding source contact and the short-circuit path between the corresponding field plate contact and the corresponding gate contact.

Unless otherwise defined, all terms (including technical and scientific terms) used herein have the same meaning as commonly understood by one of ordinary skill in the art to which this invention belongs. It should be further understood that terms such as those defined in commonly used dictionaries should be interpreted as having a meaning that is consistent with their meaning in the context of the relevant art and will not be interpreted in an idealized or overly formal sense unless expressly so defined herein.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A semiconductor structure comprising:
a substrate having a first conductivity type;
a first well formed on the substrate and having the first conductivity type;
a second well formed on the substrate and having a second conductivity type;
a first doped region formed in the first well and having the second conductivity type;
a second doped region formed in the second well and having the second conductivity type;
a gate electrode disposed on the substrate, wherein the gate electrode, the first doped region, and the second doped region constitute a first transistor, and the first doped region serves as a source region of the first transistor;
a first insulating layer disposed on the substrate and overlapping a portion of the gate electrode;
a field plate overlapping the first insulating layer and the gate electrode; and
a tunable circuit coupled to the field plate, the gate electrode, and the first doped region, wherein the tunable circuit provides a first short-circuit path between the field plate and the gate electrode, or provides a second short-circuit path between the field plate and the source region of the first transistor.

2. The semiconductor structure as claimed in claim 1, wherein the tunable circuit comprises:
 a first switch circuit coupled between the field plate and the gate electrode; and
 a second switch circuit coupled between the field plate and the first doped region.

3. The semiconductor structure as claimed in claim 2, wherein the first switch circuit comprises:
 a first inverter inverting a control signal to generate a first inverted signal;
 a first switch coupled the field plate and the gate electrode and receiving the first inverted signal; and
 a second switch coupled between the field plate and the gate electrode and receiving the control signal.

4. The semiconductor structure as claimed in claim 3, wherein the second switch circuit comprises:
 a second inverter inverting the control signal to generate a second inverted signal;
 a third switch coupled between the field plate and the first doped region and receiving the control signal; and
 a fourth switch coupled between the field plate and the first doped region and receiving the second inverted signal.

5. The semiconductor structure as claimed in claim 4, wherein each of the first and third switches is an N-type transistor, and each of the second and fourth switches is a P-type transistor.

6. The semiconductor structure as claimed in claim 1, wherein the second well is formed in the first well and the first insulating layer overlaps a portion of the second well and a portion of the second doped region.

7. The semiconductor structure as claimed in claim 1, wherein the second conductivity type is complementary to the first conductivity type.

8. The semiconductor structure as claimed in claim 1, further comprising:
 a second insulating layer overlapping the first well, the second well, the first doped region, the second doped region, the gate electrode, the first insulating layer, and the field plate,
 wherein the first insulating layer and the second insulating layer are formed in different steps.

9. An operation circuit comprising:
 a first transistor formed in a first region of a substrate and comprising a field plate contact, a first gate contact, a first drain contact, and a first source contact;
 a first tunable circuit forming a first short-circuit path between the first field plate contact and the first gate contact or forming a second short-circuit path between the first field plate contact and the first source contact;
 a second transistor formed in a second region of the substrate and comprising a second field plate contact, a second gate contact, and a second source contact; and
 a second tunable circuit forming a third short-circuit path between the second field plate contact and the second gate contact, or forming a fourth short-circuit path between the second field plate contact and the second source contact,
 wherein
 the first field plate contact is electrically connected to a field plate,
 the first gate contact is electrically connected to a gate electrode,
 the first source contact is electrically connected to a first doped region,
 the first drain contact is electrically connected to a second doped region, and
 an insulating layer is disposed between the field plate and the gate electrode and overlaps a portion of the gate electrode and a portion of the second doped region.

10. The operation circuit as claimed in claim 9, wherein the first tunable circuit comprises:
 a first switch circuit coupled between the first field plate contact and the first gate contact; and
 a second switch circuit coupled between the first field plate contact and the first source contact.

11. The operation circuit as claimed in claim 10, wherein the first switch circuit comprises:
 a first inverter inverting a control signal to generate a first inverted signal;
 a first switch coupled between the first field plate contact and the first gate contact and receiving the first inverted signal; and
 a second switch coupled between the first field plate contact and the first gate contact and receiving the control signal.

12. The operation circuit as claimed in claim 11, wherein the second switch circuit comprises:
 a second inverter inverting the control signal to generate a second inverted signal;
 a third switch coupled between the first field plate contact and the first source contact and receiving the control signal; and
 a fourth switch coupled between the first field plate contact and the first source contact and receiving the second inverted signal.

13. The operation circuit as claimed in claim 12, wherein each of the first and third switches is an N-type transistor, and each of the second and fourth switches is a P-type transistor.

14. The operation circuit as claimed in claim 9, wherein each of the first and second transistors is a silicon transistor or high electron mobility transistor.

15. The operation circuit as claimed in claim 10, wherein the first tunable circuit provides the first short-circuit path between the first field plate contact and the first gate contact, and the second tunable circuit provides the fourth short-circuit path between the second field plate contact and the second source contact.

16. The operation circuit as claimed in claim 10, wherein the first region is adjacent to the second region.

17. The operation circuit as claimed in claim 10, further comprising:
 a third transistor formed in a third region of the substrate and comprising a third field plate contact, a third gate contact, and a third source contact; and
 a third tunable circuit forming a fifth short-circuit path between the third field plate contact and the third gate contact, or forming a sixth short-circuit path between the third field plate contact and the third source contact.

18. The operation circuit as claimed in claim 17, wherein the third region is located between the first and second regions.

19. The operation circuit as claimed in claim 18, wherein the first tunable circuit provides the first short-circuit path between the first field plate contact and the first gate contact, the second tunable circuit provides the fourth short-circuit path between the second field plate contact and the second source contact, and the third tunable circuit provides the fifth short-circuit path between the third field plate contact and the third gate contact.

20. The operation circuit as claimed in claim 18, wherein the first tunable circuit provides the first short-circuit path between the first field plate contact and the first gate contact, the second tunable circuit provides the fourth short-circuit path between the second field plate contact and the second source contact, and the third tunable circuit provides the sixth short-circuit path between the third field plate contact and the third source contact.

\* \* \* \* \*